United States Patent [19]
Nagata et al.

[11] 4,071,383
[45] Jan. 31, 1978

[54] PROCESS FOR FABRICATION OF DIELECTRIC OPTICAL WAVEGUIDE DEVICES

[75] Inventors: Seiichi Nagata, Sakai; Tsuneo Tanaka; Masakazu Fukai, both of Nishinomiya, all of Japan

[73] Assignee: Matsushita Electric Industrial Co., Ltd., Japan

[21] Appl. No.: 685,368

[22] Filed: May 11, 1976

[30] Foreign Application Priority Data

May 14, 1975 Japan .................................. 50-57638

[51] Int. Cl.$^2$ .................. H01L 21/203; H01L 29/205
[52] U.S. Cl. ...................................... 148/175; 29/582; 156/610; 156/612; 156/613; 156/614; 350/96 WG; 357/16; 357/18
[58] Field of Search ................. 148/174, 175; 156/610, 156/612–614; 427/87, 294; 350/96 WG; 357/16, 18; 29/582

[56] References Cited

U.S. PATENT DOCUMENTS

| | | | |
|---|---|---|---|
| 3,047,438 | 7/1962 | Marinace | 148/175 |
| 3,200,018 | 8/1965 | Grossman | 148/175 |
| 3,533,862 | 10/1970 | Gleim et al. | 148/175 |
| 3,571,918 | 3/1971 | Haberecht | 148/175 X |
| 3,790,902 | 2/1974 | Miller | 350/96 WG X |
| 3,809,686 | 5/1974 | Chandross et al. | 350/96 WG X |
| 3,865,625 | 2/1975 | Cho et al. | 148/175 X |
| 3,893,876 | 7/1975 | Akai et al. | 148/175 |
| 3,915,765 | 10/1975 | Cho et al. | 148/175 |

OTHER PUBLICATIONS

Cho et al., "Molecular Beam Epitaxy of GaAs, $Al_xGa_{y-x}As$ and GaP", 1970 Symposium on GaAs, Paper No. 2, p. 18–29.

Ludeke et al., "Fabrication . . . Injection Laser", IBM Tech. Discl. Bull., vol. 15, No. 2, July 1972, pp. 546–547.

*Primary Examiner*—L. DeWayne Rutledge
*Assistant Examiner*—W. G. Saba
*Attorney, Agent, or Firm*—Burgess, Ryan and Wayne

[57] ABSTRACT

The present invention discloses a process for fabrication of dielectric optical waveguide devices by utilizing selective epitaxial growth. Concentrated energy such as an electron or laser beam is focused on a predetermined region on the surface of a substrate during the epitaxial growth with the application of molecular beams so that the mixed crystal grown in the irradiated region may have a chemical composition different from that of the mixed crystal grown on the non-irradiated region. Since this process permits to overlaying the embedded waveguides one upon another, complex optical waveguide devices can be fabricated in a simple manner.

10 Claims, 8 Drawing Figures

PROCESS FOR FABRICATION OF DIELECTRIC OPTICAL WAVEGUIDE DEVICES

BACKGROUND OF THE INVENTION

The present invention relates to a process for fabrication of dielectric optical waveguide devices by utilizing molecular beam epitaxial growth in order to fabricate semiconductor compounds and to form thin films of the mixed crystals thereof.

The prior art processes for fabricating three-dimensional thin-film waveguide devices may be divided into three types. In the first type, a thin film having a high refractive index is formed over the surface of a substrate having a low refractive index, and an etching mask having a desired pattern is placed upon the thin film so that the undesired portions of the thin film are etched out to form the waveguides.

According to the second type, a thin film having a high refractive index is formed over the surface of a substrate having a low refractive index, and guide patterns having a refractive index slightly lower than the refractive index of the thin film are placed upon the thin film so that the regions immediately below the guide patterns may have an apparent increased refractive index.

The third type is a selective epitaxial process in which a suitable shadow mask is used to interrupt one or more of the molecular beams from being applied to the surface of a substrate.

In general, in the waveguides the interfaces must be finished with an extremely high degree of accuracy in order to minimize the loss due to the scattering of light. However, according to the first or etching process, it is most difficult to finish the side faces of the waveguide with a desired high degree of accuracy, and the structure and optical properties of the waveguide are very sensitive to the dimensional accuracy of the side faces. Therefore it is extremely difficult to attain the desired structure and optical properties of the waveguides.

In the waveguides fabricated by the second type of process, the light energy is substantially propagated in the regions immediately below the guide patterns. Therefore accuracy of dimension of the side faces is not so severe, but the side faces must be finished with the same degree of accuracy with that of the side faces of the waveguides fabricated by the first or etching process if it is desired to couple the light signals transmitted through the different waveguides.

The third type of process has a distinct advantage over the first and second types in that three-dimensional embedded waveguides can be formed by a series of epitaxial growth steps. However selective epitaxial growth utilizes the shadows of a mask which are cast on different regions on the surface of the substrate due to the difference in incidence angle between the molecular beams. Therefore, except for straight waveguides, it is difficult to form a waveguide in a complex configuration or a plurality of waveguides which are arrayed in parallel with each other.

In addition, the above prior art processes have a common defect that the top surfaces of waveguide devices are irregular; that is, they are not flat. That is, two-dimensional waveguides may be formed, but the three-dimensional waveguide devices in which a plurality of two-dimensional waveguides are overlayed one upon another cannot be fabricated.

SUMMARY OF THE INVENTION

In view of the above, one of the objects of the present invention is to provide a process for the fabrication of dielectric optical waveguide devices with complex waveguide configurations in a very simple manner.

Another object of the present invention is to provide a process for fabricating waveguide devices in which a plurality of waveguides are overlayed three-dimensionally one over another.

A further object of the present invention is to provide a process for fabricating waveguide devices in which the loss at the interfaces of waveguides can be minimized.

To the above and other ends, the present invention provides a process for the fabrication of dielectric optical waveguide devices by utilizing thin films of epitaxially grown mixed crystals of compounds, said process characterized by applying molecular beams of the elements which become the constituents of said compounds over the surface of a crystal substrate heated at a predetermined temperature in vacuum while locally irradiating a predetermined region over the surface of said substrate with concentrated energy so that the epitaxial growth conditions may be different between the concentrated energy irradiated region and the non-irradiated region and consequently the composition of the mixed crystal grown in the irradiated region may be different from the composition of the mixed crystal grown over the irradiated region, whereby the region having a higher refractive index can be formed within the region having a low refractive index.

The above and other objects, features and advantages of the present invention will become more apparent from the following description taken in conjunction with the accompanying drawings.

DESCRIPTION OF THE PREFERRED EMBODIMENTS

Prior Art, FIG. 1

Figure 1A:
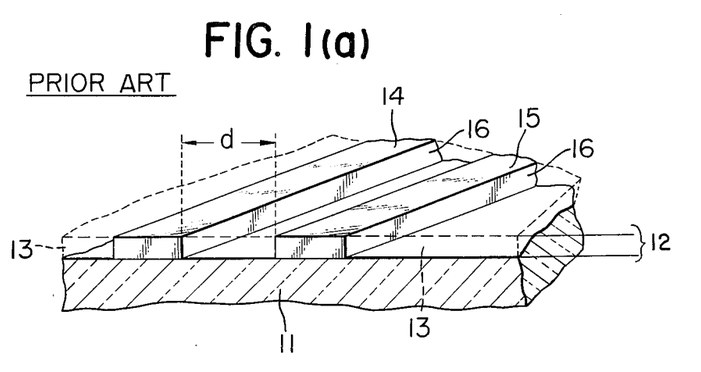
FIGS. 1(a), (b) and (c) are views used for the explanation of the prior art processes.

Prior to the description of the preferred embodiments of the present invention, the prior art processes for fabrication of three-dimensional thin-film waveguide devices will be briefly described. The prior art processes are divided into three types. According to the first type, a thin film 12 having a high refractive index is formed over the top surface of a substrate 11 having a low refractive index as shown in FIG. 1(a), and an etching mask having a desired pattern is formed upon the high refractive index thin film 12 to remove desired parts 13 of the thin film 12, whereby the remaining parts 14 and 15 are used as three-dimensional thin-film waveguides.

Figure 1B:
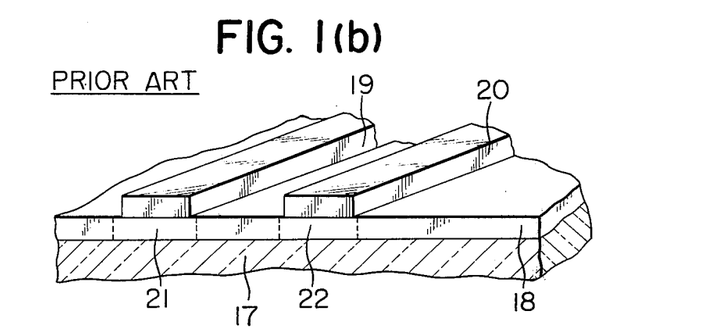

According to the second type of fabrication process, a thin film 18 having a high refractive index is deposited upon a substrate 17 having a low refractive index as shown in FIG. 1(b), and then guide patterns 19 and 20 having a refractive index slightly lower than the refractive index of the thin film 18 are formed upon the film 18 so that the regions 21 and 22 immediately below the guide patterns 19 and 20 may have an apparent increased refractive index.

Figure 1C:
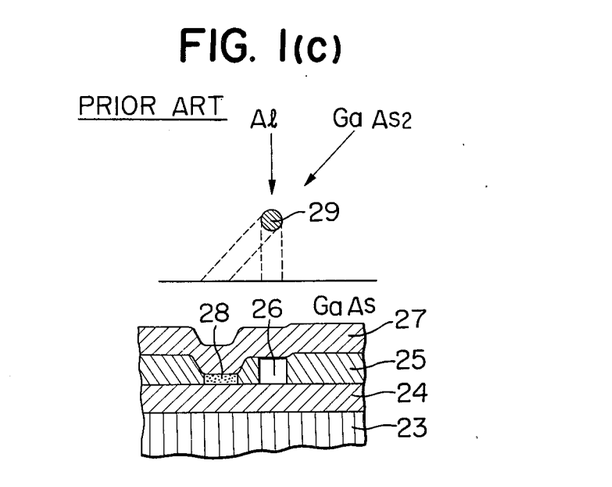

The third type is the molecular beam epitaxial process with the use of a mask as shown in FIG. 1(c). That is, the source of the Al beam and the source of the Ga and $As_2$ beam are so arranged that the beams may be incident at different angles on the surface of a GaAs substrate 23. A first layer 24 consisting of $Al_xGa_{1-x}As$ is grown over the top surface of the substrate 23 by the uniform application of the Al and $GaAs_2$ beams. Thereafter a wire 29 is placed at a suitable height from the top surface of the substrate 23, and a second layer 25 consisting of $Al_xGa_{1-x}As$ is grown. A GaAs film is grown over a region 26 which is shadowed by the wire 29 with respect to the Al beam while an Al film is grown over a region 28 which is under the shadow of the wire with respect to the Ga and $As_2$ beam. Over the region which is not in the shadows of the wire 29, however, the $Al_xGa_{1-x}As$ film is formed. Thereafter the wire 29 is removed, and both the Al and $GaAs_2$ beams are uniformly applied again to grow a third layer 27 consisting of $Al_xGa_{1-x}As$, whereby a high refractive index region 26 surrounded by or imbedded in the low refractive index regions consisting of $Al_xGa_{1-x}As$ is formed and used as a thin-film waveguide.

The above prior art processes however have their own inherent problems to be described below. In general, the interfaces of the thin-film waveguides must be finished with an extremely high degree of accuracy in order to minimize the loss due to the scattering of light at the interface. Even though the etching techniques have recently made a great advance, the dimensional accuracy of the side face 16 of the waveguide fabricated by the first or etching process is still inferior to that of the top surface. When the light waves propagated through the thin-film waveguides 14 and 15 are combined by, for instance, a directional light coupler, the intensity of coupling is in inverse proportion to an exponential function of a distance $d$ between the waveguides 14 and 15. Therefore the most critical parameter which is extremely sensitive to the structure and optical properties of the waveguide is dependent upon the dimensional accuracy of the side face 16 which is most difficult to attain.

In case of the thin-film waveguide device shown in FIG. 1(b), a substantial portion of light energy is transmitted through the regions 21 and 22. Therefore the dimensional accuracy of the side face of the guide pattern 19 or 20 is not so close as that of the thin-film waveguide shown in FIG. 1(a). However the same degree of dimensional accuracy is required when the light waves transmitted through the two waveguides must be coupled.

In case of the third type shown in FIG. 1(c) process, there is an advantage in that a three-dimensional embedded waveguide can be formed by a series of epitaxial growth steps. However since the shadows of the wire or mask on the substance are utilized, there arise some difficult problems when the nonlinear thin-film waveguides or a plurality of parallel waveguides are to be formed.

In addition to the above problems, the above three prior art processes have a common defect that the surface of the thin-film waveguide device is irregular because of the patterns of the waveguides and guides so that only two-dimensional waveguides may be formed but three-dimensional or multilayer waveguide devices cannot be formed.

The selective epitaxy technique in accordance with the present invention is based upon the molecular beam epitaxial growth combined with selective crystal growth. That is, the probability of adhesion to the substrate of the molecules which are uniformly incident thereupon is changed by heating a selected region of the substrate with concentrated radiation energy such as an electron or light beam so that the substrate is uniformly heated, whereby the composition of the mixed crystal in the thin film which is epitaxially grown may be changed.

As is well known, the molecular beam epitaxy is a process for applying beams of elements which become the constituents of the desired crystal over the surface of a substrate which is heated in vacuum, thereby growing a thin film. This technique has been mainly utilized in the fabrication of Group III V semiconductor compounds and in the epitaxial growth of mixed crystals thereof. In general, the Group III elements are Al, Ga and In while the Group V elements are P, As and Sb.

Next for the sake of understanding of the present invention, the underlying principle of the molecular beam epitaxy will be explained in conjunction with the crystal growth as GaAs. The beam of Ga and $As_2$ are applied to a substrate which has a cleaned surface and is heated in vacuum. The vapor pressure of Ga is low, and a substantial part of the Ga beam adheres to the substrate even when only the Ga beam is incident thereupon (Adhesion coefficient $\simeq$ 1). However $As_2$ adheres to the substrate only when it is combined with free Ga on the surface of the substrate. The As which cannot combine with Ga are discharged into vacuum. Therefore, when the ratio between the intensities of the $As_2$ and Ga beams is kept higher than 1, it is possible to grow the stoichimetric crystals. The substrate is heated in vacuum so that it is decomposed and evaporated with a vapor pressure corresponding to the heating temperature. However when the Ga and $As_2$ beams incident upon the substrate are sufficiently greater in quantity than the evaporation of the substrate, the effects of the evaporation on the crystal growth are negligible. Therefore unlike the liquid or gas phase process in which the crystal is grown in the equilibrium state, the crystal growth rate is not dependent upon the temperature of the substrate but is dependent upon the amount of the Ga beam incident thereupon. The temperature of the substrate at which the crystal grows ranges between 450° and 650° C in case of GaAs.

The surface of the substrate changes depending upon the intensity ratio C between the $As_2$ and Ga beams; that is, $$C = IAs_2/IGa$$

and the substrate temperature Ts. When the ratio C is maintained constant and when the substrate temperature Ts is low, the surface of the substrate is As stabilized. On the other hand, when the substrate temperature Ts is high, the surface is Ga stabilized. When the substrate temperature Ts is maintained constant and when the ratio C is increased, the surface is As stabilized. When the ratio C approaches unity, the surface is Ga stabilized. There are less free Ga atoms on the crystal growing surface of the As stabilized surface. That is, the surface is covered almost with Ga atoms. The fact that the surface structure can be changed by changing the substrate temperature shows that As atoms on the outermost surface are not thermally stable even when they combine with Ga atoms and that As atoms on the As stabilized surface are normally discharged again into vacuum, thus being replaced with new As atoms incident on the substrate as the molecular beam.

Figure 2:
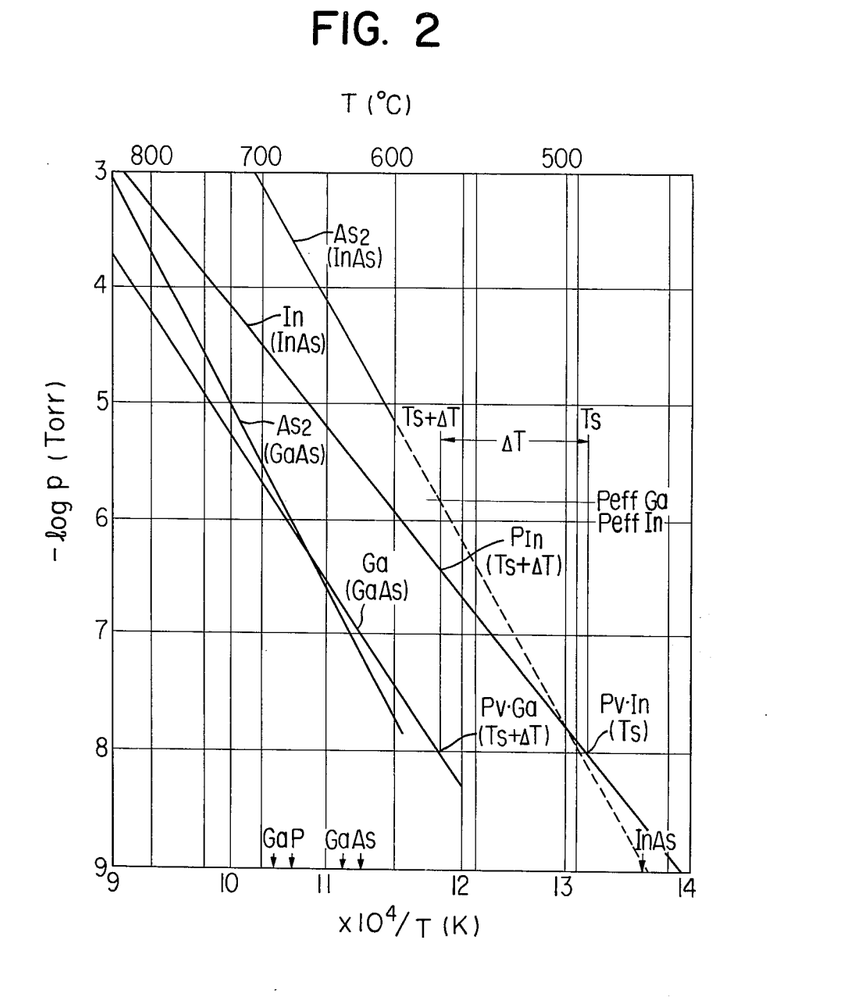
FIG. 2 is a graph illustrating the equlibrium vapor pressures of GaP, GaAs and InAs and used for the explanation of the dependence of the composition of the crystal upon the substrate temperature.

FIG. 2 shows the equilibrium vapor pressures of GaP, GaAs and InAs. The crystal is dissociated into Group III and V compounds and evaporated. Group III compounds are in the form of atoms while Group V compounds are, in general, in the form of a molecule consisting of two atoms. In FIG. 2, $As_2(InAs)$ indicates the vapor pressure of the molecular $As_2$ evaporated from the compound InAs, and the same is true for other symbols.

Next referring particularly to FIG. 2, the dependence of the crystal structure on the substrate temperature will be explained when the mixed crystal is grown on a substrate by uniformly applying the molecular beams with constant intensity.

$III_{(1)} \cdot III_{(2)} \cdot V$ type mixed crystal (i)

In $_xGa_{1-x}As$ is taken as an example. The substrate temperature is maintained at Ts in FIG. 2, and the effective pressure of the As beam is selected higher than the sum of the effective pressure $P_{eff}Ga$ of the Ga beam and the effective pressure $P_{eff}In$ of the In beam. Assume that at the substrate temperature Ts, the vapor pressures of Ga and In be Pv·Ga (Ts) and Pv·In (Ts), respectively. Then $P_{eff}Ga >> Pv\cdot Ga(Ts)$, and $P_{eff}In >> Pv\cdot In(Ts)$.

Therefore, the vapor pressures are negligible as compared with the effective pressures of the beams incident on the substrate so that $Ga_{1-x}In_xAs$ having a composition equal to the intensity ratio between the Ga and In beams is grown on the substrate.

When the substrate temperature is changed from Ts to Ts + ΔT, the vapor pressure of Ga is negligible because it is sufficiently lower than the effective pressure of the Ga beam incident upon the substrate, but the vapor pressure of In is not negligible as compared with the effective pressure of the In beam incident on the substrate. Therefore the ratio of In in the crystal grown at Ts + ΔT is less than the ratio of the intensity of the In beam to the intensity of the Ga beam. This means that when the temperature of a preselected local area of the substrate is changed with respect to the temperature of the other area of the substrate during the crystalization of GaInAs by the application of the Ga, In and $As_2$ beams, the crystal having a different In concentration can be formed at the preselected region within the crystal growing surface.

$III \cdot V_{(1)} \cdot V_{(2)}$ type mixed crystal (ii)

$GaAs_{1-y}P_y$ is taken as an example. The Ga, $As_2$ and $P_2$ beam are applied to a heated substrate to grow the crystal. As with the case of GaAs, the intensities or effective pressures of the beams and the substrate temperature determines the crystal growth conditions under which the substrate surface is stabilized with a Group V element such as As or P or the conditions under which the substrate surface is stabilized with a Group III element such as Ga. In case of a Ga stabilized surface, the surface is already covered with As atoms so that the probability of $As_2$ or $P_2$ combining with Ga immediately after $As_2$ or $P_2$ is incident upon the surface of the substrate is much less. That is, $As_2$ or $P_2$ must remain for some time on the substrate surface covered with the Group III element before $As_2$ or $P_2$ is included in the crystal. On the surface stabilized with a Group V element, the staying time of $As_2$ is longer than the staying time of $P_2$ so that the ratio $(1-y)/y$ between As and P in the crystal is greater than the intensity ratio $P_{As_2}/P_{P_2}$ between the $As_2$ and $P_2$ beams.

When the substrate temperature is increased, the substrate surface is stabilized with a Group III element so that $As_2$ or $P_2$ incident upon the substrate can immediately combine with free Ga. However, As or P in the outermost layer is thermally dissociated and discharged again into vacuum. The probabilities of combination with Ga and dissociation from Ga are different between $As_2$ and $P_2$ so that the ratio between Group V elements in the crystal is different from the intensity ratio of the $As_2$ and $P_2$ beams.

As described above, the ratio between Group V compounds in the crystal is not equal to the intensity ratio of the beams of these compounds regardless of the fact that the crystallization occurs on the Group III or V element stabilized surface of the substrate, and the crystal growth rates are different. Therefore when the intensities of the beams are maintained constant and the local temperature of the substrate is charged during the crystallization, the composition of the crystal changes depending upon the temperature distribution of the substrate during the crystallization. That is, selective epitaxial growth can be attained.

$III_{(1)} \cdot III_{(2)} \cdot V_{(1)} \cdot V_{(2)}$ type mixed crystal (iii)

The combined effect of the effects of the change in substrate temperature described in (i) and (ii) may be obtained.

So far the thermal effects attained when the concentrated radiation energy such as an electron or light beam is applied to the surface of the substrate during the molecular beam epitaxial growth have been described. In vacuum, the molecular beams are ionized by the electron beam, and on the surface of the substrate a large number of electrons and holes are produced by the electron beam.

The number of atoms incident upon the substrate can be locally changed by utilizing the ionization probabilities of the molecular beams and applying a voltage across the substrate, whereby selective epitaxial growth can be attained. In addition, the adhesion probability of atoms or molecules incident to the substrate can be also changed by producing high density carriers on the surface of the substrate.

The thermal effects and the excitation of electrons and holes are also attained by the radiation of light. Furthermore, various molecules can be selectively ionized by the radiation of light having a photon energy above that of light in the vacuum ultraviolet region.

The electron beam and the light beam can be simultaneously produced and applied to the substrate so that the selective epitaxial growth can be attained by the combined effect of the electron and light beams. In case of the light beam, a two-dimensional mask may be used to project and focus a desired pattern on the substrate. In like manner, the electron beams may be emitted from a plurality of plate cathodes arrayed two-dimensionally so that a plurality of desired areas on the surface of the substrate may be irradiated simultaneously.

The selective epitaxial processes described above are applied not only in the growth of the mixed crystals of the Group III·V compound semiconductors but also in the fabrication of Group II·VI or IV·VI semiconductor compounds and dielectrics.

As described above, during the crystal growth of a compound by the application of the atom and/or molecular beams, the surface of the substrate may be locally irradiated with the electron and/or light beams so that the crystals grown over the irradiated regions may have chemical compositions different from the composition of the crystal grown in the nonirradiated region. Thus waveguides can be formed within the thin-film crystal.

Figure 3:
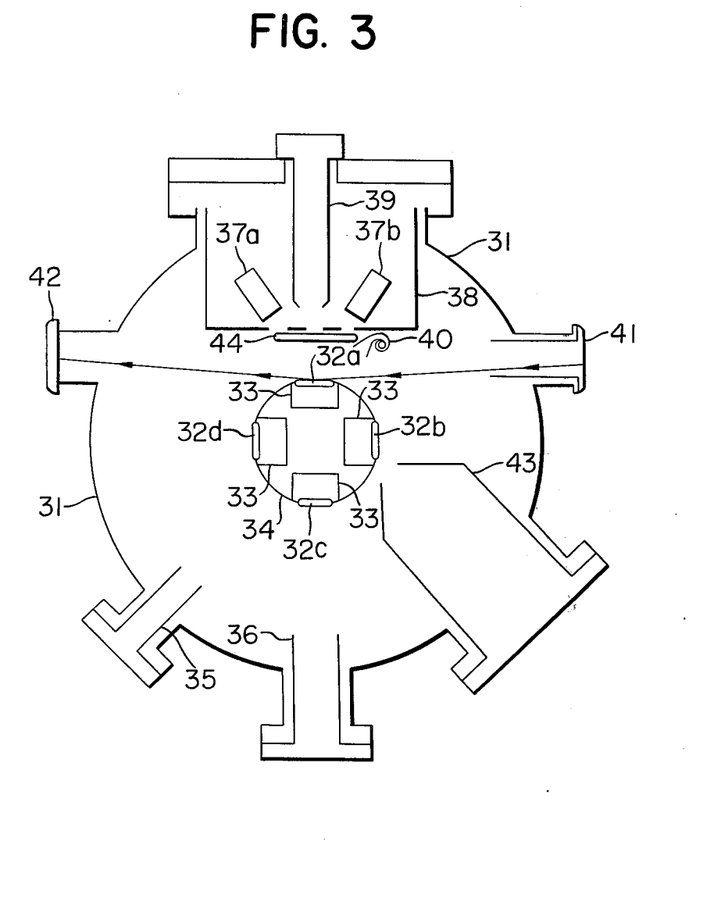
FIG. 3 is a schematic view of one system for carrying out the process in accordance with the present invention.

Next referring to FIG. 3, the process for the fabrication of thin-film waveguides in accordance with the present invention will be described in more detail hereinafter. FIG. 3 is a schematic view of the system used for molecular beam epitaxial growth and provided with an electron gun in order to carry out the selective epitaxial process in accordance with the present invention. A vacuum apparatus denoted 31 heats itself to about 350° C to discharge various gases adhered to the inner wall thereof, thereby maintaining an ultrahigh vacuum with the remaining gas pressure being of the order of $10^{-10}$ Torr. Substrates 32 (32a, 32b, 32c and 32d) are each attached on a heating block 33 so that the substrate may be heated by a heating element (not shown) in the heating block 33. A sample position setting device 34 is operable from the exterior of the vacuum apparatus 31 in such a way that a plurality of samples may be changed and the position of each sample may be changed. An ion sputtering device 35 is for sputtering the surface of the sample to obtain an atomically clean or purified sample surface. A quadrupole mass spectrometer 36 not only monitors the molecular beams emitted from molecular beam sources 37 but also analyzes the remaining gas. Knudsen cell type molecular beam sources, 37a and 37b, each of which has an element which becomes a constituent of a crystal to be grown, and which are heated independently from each other so that the desired intensity of the molecular beam may be obtained are provided.

A liquid nitrogen cover 38 absorbs the undesired molecules when the sources 37a and 37b are heated, thereby maintaining the vacuum in the apparatus at a desired level. An electron gun 39 includes electrostatic deflection electrodes for producing the electron beam which irradiates a preselected region on the surface of the substrate 32a. In this system, the electron beam is made incident on the surface of the substrate 32a substantially at a right angle. A secondary electron multiplier 40 is for detecting the electrons produced from the region irradiated by the electron beam, thereby detecting this region. A high-energy electron gun 41 is for producing the electron beam which is made incident to the surface of the substrate at an angle smaller than the incidence angle of the electron beam from the electron gun 39 so that a phosphor screen 42 is illuminated by the refracted electrons so as to permit observation of the structure of the surface of the substrate 32a.

A cylindrical mirror type Auger electron spectroscope 43 is also provided. A shutter 44 is for interrupting the molecular beams. With an electron beam control circuit (not shown), brightness modulation is made in order to deflect the electron beam so that the beam may be incident upon a desired area, and a display device (not shown) deflects the electron beam in a cathode-ray display tube in synchronism with the beam deflection signal so that the intensity of the electron beam in the cathode-ray tube may be modulated in response to the output signal from the secondary electron multiplier tube 40. Therefore the required sequential controls can be accomplished by the comparison of a position displayed on the display tube with the position of the electron beam irradiated area on the surface of the substrate 32a.

Next the epitaxial growth of the GaAs$_y$P$_{1-y}$ mixed crystal on the GaAs (001) surface of a substrate 32 by the above described system will be described.

Figure 4:
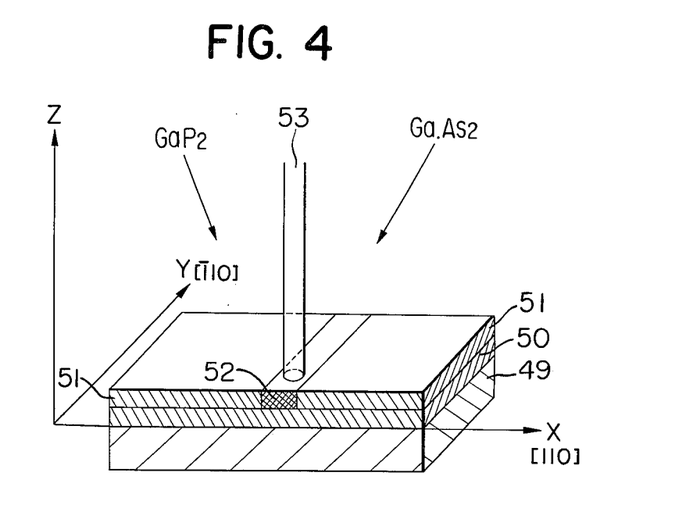
FIG. 4 is a view used for the explanation of the selective epitaxial process in accordance with the present invention.

As shown in FIG. 4, the rectangular substrate 49 extending in the directions [110] and [$\bar{1}$10] was prepared from a GaAs substrate cut along the (001) face, and then was polished with the diamond paste. Thereafter the substrate was etched with a brome-methanol-series etchant, and was mounted on the sample position setting device 34 shown in FIG. 3. GaP was charged into the source 37a while GaAs was charged into the source 37b. The vacuum device 31 was heated for 10 hours to evacuate to an ultrahigh vacuum of the order of $10^{-10}$mm Hg. The substrate 49 was heated to 630° C to attain thermal etching of the surface of the substrate. Thereafter, ion etching of the surface of the substrate 32 was carried out by the ion sputtering device 35. It was confirmed by the use of the Auger spectroscope 43 that the surface of the substrate was atomically clean. The substrate 49 was maintained at 530° C while liquid nitrogen was charged into the cover 38. Thereafter the GaAs source was heated to 830° C while the GaP source 37a to 800° C. The shutter 44 was opened to direct the Ga, As$_2$ and P$_2$ beam to the substrate 49 as shown in FIG. 4 so that an epitaxially grown layer 50 having a uniform mixed crystal composition was formed over the whole surface of the substrate 49. Thereafter while the Ga, As$_2$ and P$_2$ beams were applied under the same conditions, the substrate was scanned in the [110] direction by the electron beam 53 which had a spot diameter of about 200 μm and which was accelerated to 3 KeV, whereby selective crystal growth was attained.

It was found that the composition of the electron beam irradiated region 52 was different from that of the non-irradiated region 51. This means that these two regions 51 and 52 have different refractive indexes. Thus the three-dimensional thin-film waveguide which had a high refractive index and was embedded in or surrounded by a medium having a low refractive index was formed by the utilization of the difference in refractive index.

Figure 5:
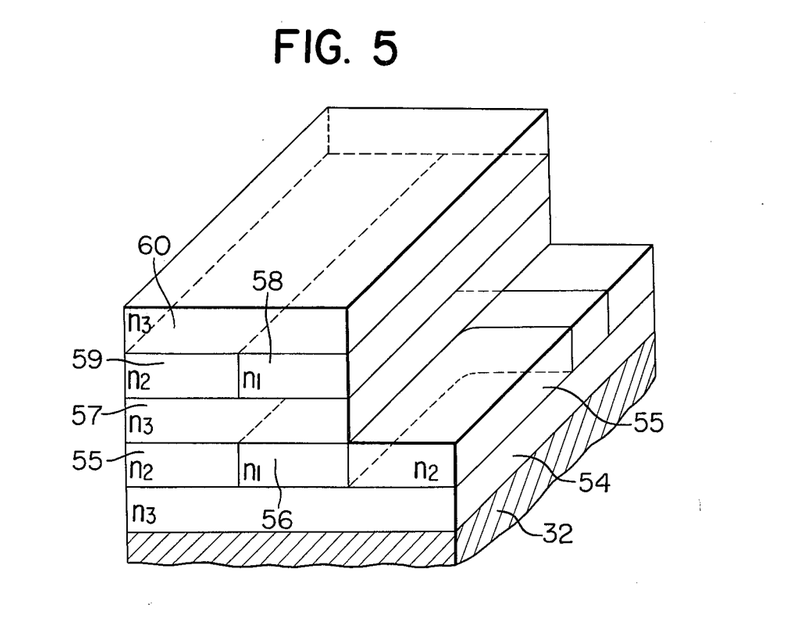
FIG. 5 is a schematic view illustrating a compound optical waveguide device fabricated by the process in accordance with the present invention.

FIG. 5 shows a compound optical waveguide device fabricated by the selective epitaxial process in accordance with the present invention. First layer 54 having a uniform $GaAs_{1-y}P_y$ composition was formed over the surface of the substrate 32. During this formation of a second layer, the temperature of the GaP source was decreased so that the intensity of the $P_2$ beam was decreased with respect to the intensity of the $As_2$ beam. Thereafter the selective epitaxial growth with the irradiation of the electron beam was made in a manner substantially similar to that described above so that a region 55 having a high P concentration and a region 56 having a low P concentration were formed. A third layer 57 was formed under the same conditions as those when the first layer 54 was formed. A fourth layer was formed under the same conditions as those when the second layer was formed, whereby a region 59 having a high P concentration and a region 58 having a low P concentration were formed. A fifth layer was formed under the same conditions with those when the first and third layers were formed. Therefore the layers 54, 57 and 60 had the highest P concentration; the regions 55 and 59 had a medium P concentration; and the regions 56 and 58 had the lowest P concentration. The lower the P concentration, the higher the refractive index becomes. Therefore the regions 56 and 58 embedded in or surrounded by the low refractive index regions serve as excellent waveguides. The optical parameters such as dielectric constant, film thickness and so on can be precisely controlled by control of the intensities of the molecular beams and the growth rate. Therefore in the compound thin-film waveguide device in which the waveguides are overlayed through the intermediate layers 57 the control of the coupling constant or coefficient between the waveguides becomes very easy. In addition, according to the present invention, the waveguides may be arrayed not only two-dimensionally but also three-dimensionally so that the fabrication of the complex waveguides such as directional couplers, light splitters and so on may be much facilitated.

The waveguide device shown in FIG. 5 has many advantages to be described below. One advantage is that the refractive index at the interface between the region 56 and the layer 57 may be changed at an arbitarily selected gradient so that a clad type or converging type interface may be formed. At the interface between the regions 55 and 56 the refractive index changes relatively gradually depending upon the position which was irradiated by the electron beam and the temperature gradient in the non-irradiated region during the selective epitaxial growth so that a convergent type intersurface is formed. Therefore the light wave energy is concentrated at the center of the waveguide so that the adverse effect caused by the scattering of light at the interface between the regions 55 and 56 due to the error in selecting the area where the electron beam is focused can be minimized.

Figure 6:
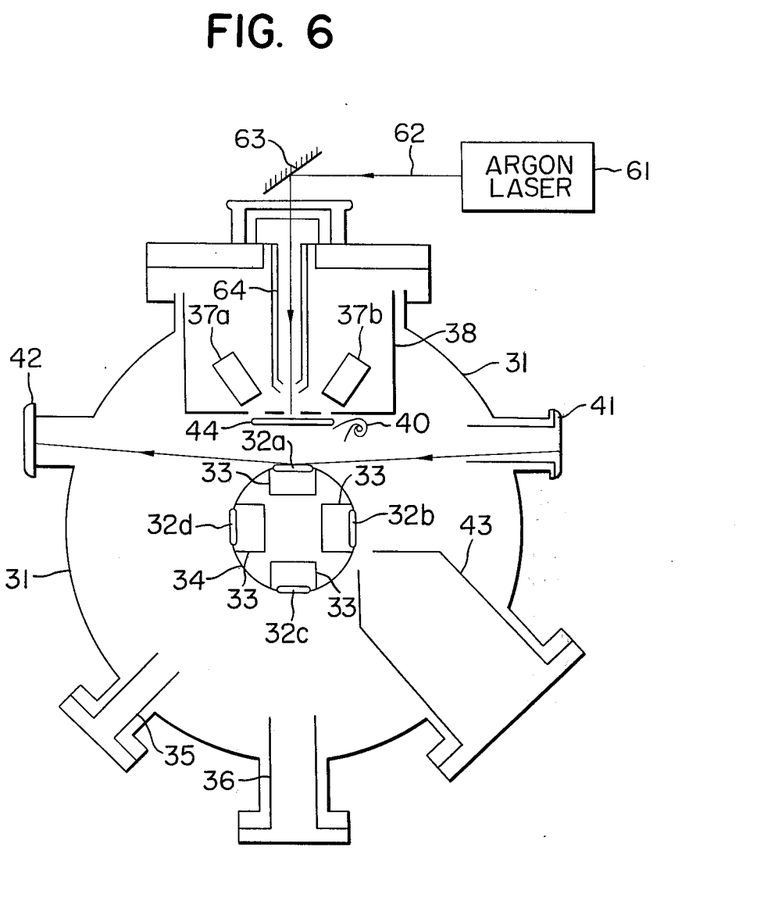
FIG. 6 is a schematic view of another system for carrying out the process in accordance with the present invention.

FIG. 6 is a shematic view of a system used for carrying out another example of the selective epitaxial process in accordance with the present invention. In this system, instead of an electron beam, a laser beam is used. The same reference numerals are used in both FIGS. 3 and 6 to designate similar parts. In this system, the laser beam 62 produced by and emitted from a laser device 61 is redirected by an oscillating mirror 62 so as to be transmitted through a waveguide 64 into the vacuum apparatus 31 and focused on the substrate 32a so that selective epitaxial growth can be carried out.

As described above, the present invention utilizes a selective molecular beam epitaxial process in which the substrate is locally heated by concentrated energy so that the composition of the mixed crystal grown in the energy irradiated area may be different from the composition of the crystal grown in the non-irradiated region. Therefore the fabrication of complex thin-film waveguides is much facilitated. Thus the present invention provides a novel process for the fabrication of thin-film waveguides.

What is claimed is:

1. A process for fabrication of dielectric optical waveguide devices by utilizing thin films of epitaxially grown mixed crystals of compounds comprising applying molecular beams of elements which become the constituents of said compounds over a surface of a crystal substrate heated at a predetermined temperature in vacuum while locally irradiating a predetermined region of the surface of said substrate with concentrated energy to thereby produce epitaxial growth conditions which are different between the irradiated region and the non-irradiated region and consequently the composition of the mixed crystal grown in the irradiated region is different from the composition of the mixed crystal grown in the nonirradiated region, whereby a region having a higher refractive index is formed within a region having a lower refractive index.

2. A process as set forth in claim 1 comprising overlaying the regions having a lower refractive index and the regions having a higher refractive index one upon another.

3. A process as set forth in claim 1 wherein said compounds are Group III·V compounds.

4. A process as set forth in claim 1 wherein said compounds comprise elements selected from Group III.

5. A process as set forth in claim 1 wherein said compounds comprise elements selected from Group V.

6. A process as set forth in claim 1 wherein said compounds consist of an element selected from Group III and an element selected from Group V.

7. A process as set forth in claim 1 wherein said concentrated energy is an electron beam.

8. A process as set forth in claim 1 wherein said concentrated energy is a laser beam.

9. A process as set forth in claim 6, wherein said compounds consist of at least two elements selected from Group III and one element selected from Group V.

10. A process as set forth in claim 6 wherein said compounds consist of at least two elements selected from Group V and one element selected from Group III.

* * * * *

UNITED STATES PATENT OFFICE
CERTIFICATE OF CORRECTION

Patent No. 4,071,383        Dated January 31, 1978

Inventor(s) Seiichi Nagata, et al

It is certified that error appears in the above-identified patent and that said Letters Patent are hereby corrected as shown below:

Column 4, line 3:   "substance" should be --substrate--.

line 30:  "Group III V" should be --Group III·V--.

line 38:  "as GaAs" should be --of GaAs--.

Column 5, line 35:  After "crystal" insert --:--.

line 37:  "In $_xGa_{1-x}As$" should be --$In_xGa_{1-x}As$--.

line 39:  "As" should be --$As_2$--.

Column 6, line 4:   After "crystal" insert --:--.

line 7:   "beam" should be --beams--.

UNITED STATES PATENT OFFICE
CERTIFICATE OF CORRECTION

Patent No. 4,071,383          Dated January 31, 1978

Inventor(s) Seiichi Nagata, et al

It is certified that error appears in the above-identified patent and that said Letters Patent are hereby corrected as shown below:

Column 6, line 44:  "charged" should be --changed--.

line 50:  After "crystal" insert --:--.

Column 7, line 34:  "the" should be --a--.

Column 8, line 22:  "the comparison" should be --a comparison--; "a position" should be --the position--.

line 32:  Before "diamond" cancel "the".

line 56:  "[110]" should be --[$\bar{1}$10]--.

Column 9, line 5:  "this" should be --the--.

Signed and Sealed this

Twenty-seventh Day of June 1978

[SEAL]

Attest:

RUTH C. MASON
Attesting Officer

DONALD W. BANNER
Commissioner of Patents and Trademarks